United States Patent [19]

Hart

[11] Patent Number: 5,164,542

[45] Date of Patent: Nov. 17, 1992

[54] COMPOSITE HOUSING FOR A COMPUTER SYSTEM

[75] Inventor: William Hart, Lake Park, Fla.

[73] Assignee: Tusk, Inc., Lake Park, Fla.

[21] Appl. No.: 740,840

[22] Filed: Aug. 2, 1991

[51] Int. Cl.⁵ .......................... H05K 9/00; H01S 4/00; B21D 39/00

[52] U.S. Cl. ........................... 174/35 MS; 174/35 R; 428/622; 428/623; 428/624; 427/300; 425/542; 425/543; 29/592.1

[58] Field of Search .......................... 364/927, 927.83; 361/424; 174/35 R, 35 MS; 219/10.55 D, 10.55 R; 427/300, 304, 305, 306, 419.5; 428/615, 621, 622, 623, 624, 626; 29/592.1; 425/542, 543

[56] References Cited

U.S. PATENT DOCUMENTS

| | | |
|---|---|---|
| 3,112,221 | 11/1963 | Price . |
| 3,230,375 | 1/1966 | Wagoner et al. . |
| 4,828,931 | 5/1989 | Ogawa et al. ........................ 428/596 |
| 4,831,210 | 5/1989 | Larson et al. ................... 174/35 MS |
| 4,896,001 | 1/1990 | Pitts et al. ........................ 174/35 MS |

Primary Examiner—Leo P. Picard
Assistant Examiner—Bot Ledynh

[57] ABSTRACT

A modular computer system is disclosed that includes a self-contained work-slate unit having a housing comprising a dense layer forming an external surface of the housing, a first layer of woven structural fiber material overlaying the relatively high density layer, a layer of closed cell foam material overlaying the first layer of structural fiber material preferably woven, a second layer of woven structural material overlaying the layer of closed cell foam material, a layer of electro-magnetic shielding material overlaying the second layer of woven structural material and a third layer of woven structural fiber material overlaying the layer of electromagnetic shielding. The first, second and third layers of woven structural fibers, the layer of electro magnetic shielding and the layer of closed cell foam are permeated with a thermoset resin for binding the respective layers of the composite housing together.

8 Claims, 18 Drawing Sheets

COMPOSITE HOUSING FOR A COMPUTER SYSTEM

FIELD OF THE INVENTION

This invention relates to the field of computer systems and more specifically to an improved modular computer system which may be used in either portable or desktop modes and which is highly resistant to hostile environments.

BACKGROUND OF THE INVENTION

Personal computers have recently become very popular for a variety of uses ranging from home, office, engineering, sales, marketing, and military applications. Virtually every aspect of business, engineering and science utilizes some form of computer system on a daily basis. Since their introduction, personal computers have become increasingly compact while simultaneously becoming increasingly powerful.

Conventional personal computers are typically configured with some type of display unit, a keyboard, and some form of housing incorporating a microprocessor, memory, disk storage devices, etc. In typical portable computers, the keyboard and computer electronics are incorporated in a base unit wherein a display device such as a liquid crystal display (LCD) is attached to the base unit with a hinge mechanism forming a configuration referred to as a "clam shell" housing. Virtually every portable computer available today utilizes the "clam shell" configuration.

While the "clam shell" configuration provides certain advantages, it also poses several problems. First, the display unit and processor unit cannot be used apart from the base unit and keyboard. Furthermore, given the premium placed on optimizing the weight of the overall computer system, current portable computer designs are relatively fragile and highly susceptible to damage due to mechanical shocks. Finally, since this configuration of portable computer provides openings in the housing for insertion of floppy disks, etc., these computer systems are susceptible to damage from humidity, and airborne pollutants, etc.

In yet another aspect of portable computer design, recent activities in the computer industry have been directed toward new types of input devices such as computer screens responsive to inputs from stylus devices or tactile inputs. In these systems, the need for a computer keyboard is greatly reduced or may be eliminated entirely. Accordingly, portable computers having integral keyboards are unnecessarily heavy and large for these applications. One well-known design goal for portable computers is that the computer system be no larger than a letter-size notebook. The incorporation of a keyboard in notebook-sized computers necessarily complicates this design goal.

While notebook-sized computers provide the advantages of portability and compact size, many users prefer desktop models which typically provide larger keyboards, unlimited power capabilities, and expanded peripheral support. Accordingly, the design goals for portable and desktop computer systems are often incompatible.

From the foregoing, no computer system is known which provides all of the advantages of a portable or notebook computer design, while incorporating an enclosure structure which is weatherproof and highly resistant to mechanical shock, while also being adaptable to desktop applications. The computer design of the present invention provides a structure which optimizes the design goals of both portable and desktop designs by providing a modular computer design which may be used in a portable mode or on a desktop, either with or without a keyboard.

SUMMARY AND OBJECTS OF THE INVENTION

In summary, the modular computer system of the present invention in a preferred embodiment includes a self-contained workslate unit having a housing; a display unit visible at a surface of the housing; input means preferably including a digitizer disposed in cooperative engagement with the display unit, a processing apparatus having an address and data bus, serial and parallel ports, modem, video and a keyboard interface, the processing apparatus system for outputting display data to the display unit and for receiving input data from the input means, digitizer and/or keyboard as well as for providing computer functions to a user including bi-directional data communications via the modem and the respective serial and parallel ports; and a mass data storage device coupled to the computer. The workslate unit further includes first connector means for providing connections for the computer data and address bus, the respective serial and parallel ports, modem, display data and the keyboard interface.

The workslate unit is adapted for use with one of several base units having a keyboard, and an expansion area for supporting one or more peripheral devices. The desktop base unit includes a docking means for engaging the workslate unit, the docking means including second connector means for coupling to the first connector means providing electrical connections for the keyboard and said one or more peripheral devices, display data, modem, address and data bus and the respective serial and parallel ports. The docking means further includes means for mechanically attaching the workslate unit to the desktop base unit.

The present invention further provides a multi-layer composite housing structure for housing the respective components of the present invention, comprising a relatively high density layer forming an external surface of the housing, a first layer of woven structural fiber material overlaying the relatively high density layer, a layer of closed cell foam material overlaying the first layer of structural fiber material, preferably woven, a second layer of woven structural fiber material overlying the layer of closed cell foam material, a layer of electromagnetic shielding material overlying the layer second layer of woven structural material, and a third layer of woven structural fiber material, wherein first, second and third layers of woven structural fibers, said layer of electromagnetic shielding and said layer of closed cell foam material of said composite housing are permeated with a thermoset resin, such as acrylic epoxy, vinylester or polyester for binding all the respective layers of the composite housing together.

Accordingly, it is an object of the present invention to provide a modular computer system which may be used in both portable or desktop modes.

It is another object of the present invention to provide a computer system which may be used either with or without a keyboard.

It is still another object of the present invention to provide an enclosure for a computer system which is highly resistant to mechanical shocks.

It is yet another object of the present invention to provide a modular computer system having an improved docking system for uniting the respective modular components of the present invention.

It is still another object of the present invention to provide a computer system which is highly resistant to damage from moisture and airborne pollutants.

It is still another object of the present invention to provide a computer system which is compact and powerful.

BRIEF DESCRIPTION OF THE DRAWINGS

These and other objects may be fully understood through the detailed description of the invention set forth below and the accompanying drawings in which.

DETAILED DESCRIPTION OF THE PREFERRED EMBODIMENT

Figure 1:
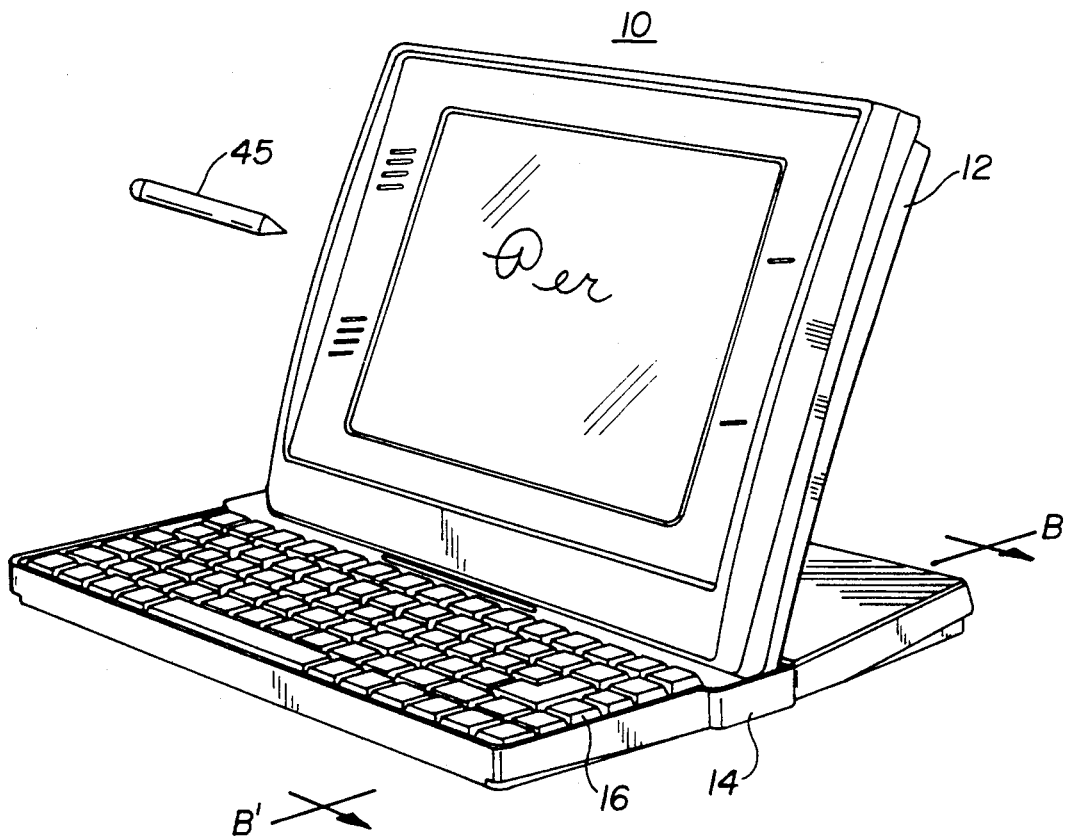
FIG. 1 is a front view in perspective of the modular computer system of the present invention showing the workslate unit attached to the base unit.
Figure 2:
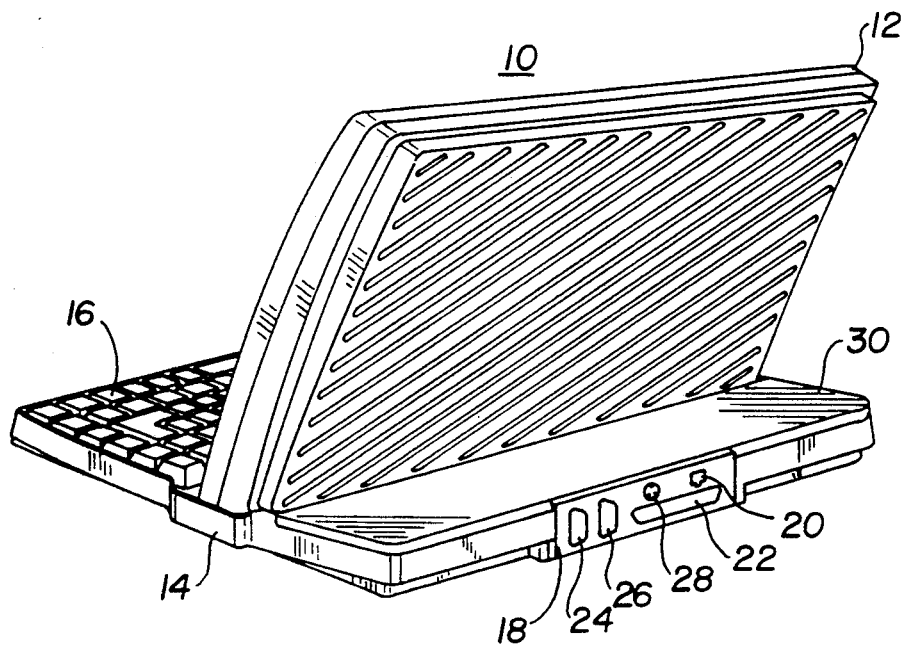
FIG. 2 is a rear view in perspective view of the modular computer system of FIG. 1.
Figure 3:
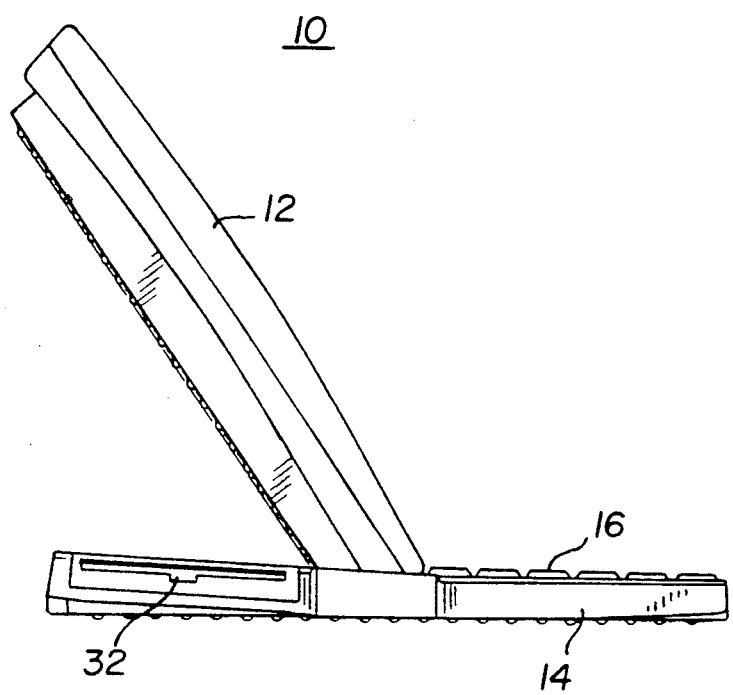
FIG. 3 is a side view of the modular computer system of FIGS. 1 and 2.
Figure 4:
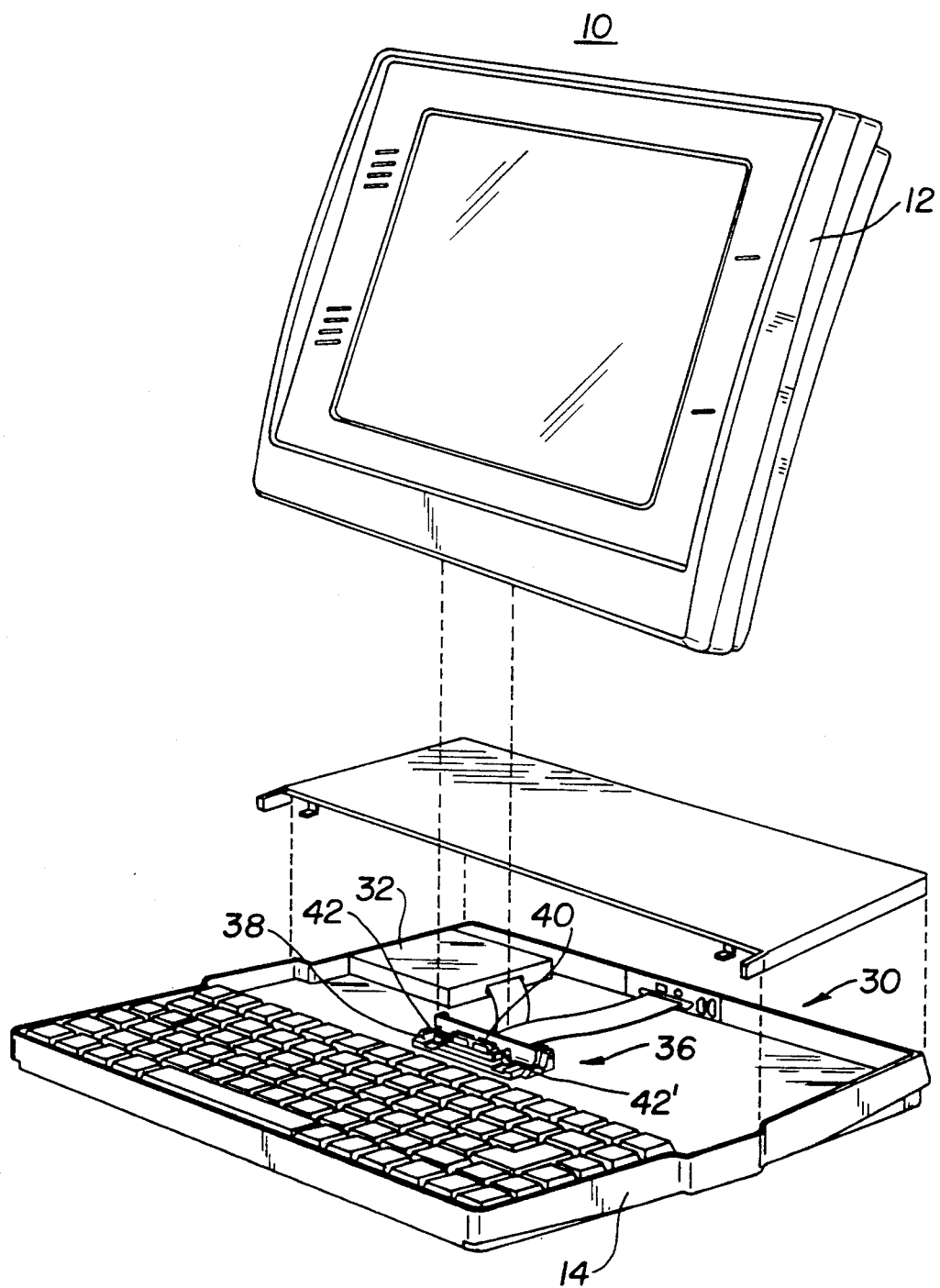
FIG. 4 is a view in perspective of the modular computer system of the present invention wherein the workslate unit is separated from the desktop base unit.

The present invention provides an improved modular computer system 10 which may be used as either a self-contained workslate or tablet unit, or in the alternative, as a complete desktop unit which includes a base having a keyboard as well as support for a variety of peripheral components. Referring now to FIGS. 1-4, the improved modular computer system 10 comprises a self-contained workslate unit 12 which may be removably attached to base unit 14. The workslate unit 12 comprises a fully functional computer system which is described in detail below. The base unit 14 incorporates a full size alphanumeric keyboard 16 and provides connections for various signals through connector area 18. Specifically, connector area 18 provides connectors for a telephone jack 20, a connector 22 which provides parallel port connections, a connector 24 for serial port connections, a connector 26 for display data connections, and a power connector 28. In one embodiment, connector plate 18 may be modified to include a connector (not shown) to provide connections for the full computer address and data bus. A variety of peripheral components may be disposed in storage area 30. For example, it is contemplated that peripheral devices such as a disk drive 32 and a numeric keypad (not shown) may be disposed in storage area 30. As shown in FIGS. 1-3, storage area 30 is relatively compact to enable a base unit 14 to be used in a portable mode. Those skilled in the art will appreciate that storage area 30 may be enlarged to include a structure for accommodating a wide variety of well-known expansion cards. As will be further described below, in the preferred practice of the present invention, workslate unit 12 may be removably attached to base unit 14 via a docking assembly 36 which includes a support flange 38, an electrical connector 40 for coupling the respective components of workslate unit 12 and base unit 14, and a plurality of latching posts 42, 42' for securing workslate unit 12 to base unit 14 (FIG. 4). The docking assembly 36 provides multi-position, pivoting, mechanical and electrical attachment for workslate 12 and base unit 14. The detailed construction and operation of docking assembly 36 is discussed in further detail below. In the preferred practice of the present invention, the workslate unit 12 is adapted for use with a stylus 45 to allow control and use of workslate unit 12 without the need for keyboard 16. It is contemplated that stylus 45 may be used for entering both text and graphic information as well as any of a number of computer control commands.

Referring now to FIGS. 5A-5D, workslate unit 12 comprises a fully functional computer system which may be used with or without a keyboard. In the preferred practice of the present invention, workslate unit 12 is provided with means, responsive to inputs from a stylus for inputting both alphanumeric data as well as computer commands. Workslate unit 12 comprises front and rear sections 44, 46, respectively, which are mated to form workslate unit 12. Front section 44 includes an outer housing member 48 which includes a display area 50. A plate of protective glass or plastic 52 is attached to the perimeter of display area 50 with a ring of pliable adhesive 56 which provides a shock resistant junction. In the preferred practice of the present invention, an adhesive designated Scotch Brand VHB 4910, available from Minnesota Mining and Manufacturing, Minneapolis, Minn. is used for adhesive ring 56. A mounting ring 58 is then disposed concentrically about plate 52 to provide a level surface for mounting the remaining components. Mounting ring 58 is preferably attached to outer housing member 48 with conventional adhesive or formed as an integral part of outer housing member 48. A liquid crystal display (LCD) panel 60 is then disposed over mounting ring 58. In the preferred practice of the present invention, an LCD panel of the type LMG9050ZZFC available from Hitachi Mobara Works, Hitachi, Ltd., Mobara City, Japan, is used for LCD panel 60. LCD panel 60 provides a display surface 64 providing the capability to control and display approximately 1024 ×768 pixels and may be used to display either text or graphic information. Digitizer 62 is secured to the rear of LCD panel 60. Digitizer 62 comprises an area of orthoganally organized conductive strips 66 coupled to appropriate decoder circuitry 68 wherein digitizer is responsive to inputs from stylus 4 to generate signals related to the position of the stylus 45 with respect to display surface 64. Thus, when used with appropriate software, digitizer 62 may be used to input text or graphic information, as well as computer control commands. For example, handwriting recognition software such as the "Nestor-Writer" handwriting recognition program available from Nestor, Inc., Providence, R.I. may be used in conjunction with digitizer 62 to enable workslate 12 to be used as a tablet which responds to handwritten characters formed over digitizer 62 (FIG. 1). As information is entered in digitizer 62, it is simultaneously displayed on display 60 to enable users to visualize information which has been entered.

Figure 7:
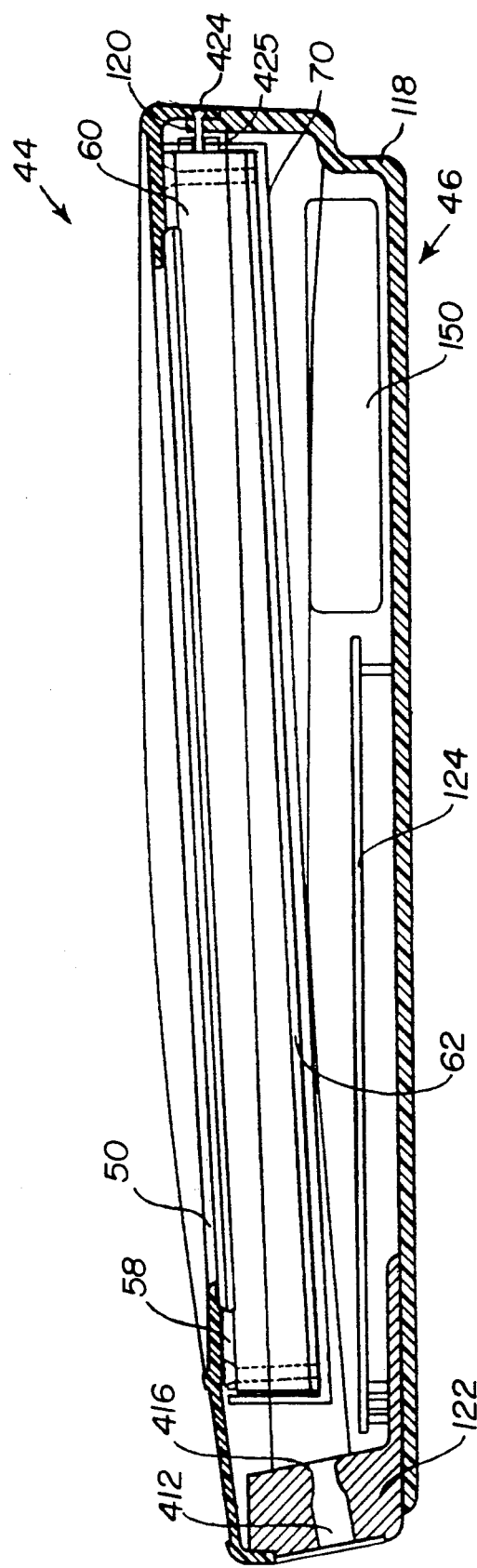
FIG. 7 is a cutaway view of the assembled workslate unit taken along section A—A'.

LCD display 60, and digitizer 62 are secured to outer housing member 48 with a shock absorbing gasket 69 and a collar member 70. Collar member 70 is formed with a plurality of vertical walls 72-78 which form a perimeter which engages the outer edges of digitizer 62, LCD panel 60 and shock absorbing gasket 69. Flanged retaining walls 80-86 are joined to vertical walls 72-78, respectively, to form a retaining surface for securing LCD display 60, digitizer 62, and shock absorbing gasket 69 to mounting ring 58. Specifically, a plurality of aligned apertures are disposed in each respective corner of LCD display 60, digitizer 62, shock absorbing gasket 69 and collar member 70 (e.g. apertures 88-92 of shock absorbing gasket 69, apertures 94-98 of LCD panel 60, apertures 100-104 of digitizer 62, and apertures of collar member 70). A plurality of fasteners (e.g. fasteners 107, 109, and 111) are then disposed through the respective apertures 88-92, 94, 96, 98, 100-104 106-110 to secure LCD display 60, digitizer 62, and collar member 70 to mounting ring 58. In the preferred practice of the present invention, a plurality of threaded inserts (e.g. threaded inserts 93, 95, 97) may be pressed into mounting ring 58 for receiving fasteners 107, 109 and 111. Electrical connections for LCD panel 60 are provided by electrical connector 112 and electrical connections for digitizer 62 are provided by electrical connector 114. The specific connection and operation of electrical connectors 112 and 114 are discussed in further detail below. The resulting fully assembled structure of front section 44 is shown in FIG. 7.

Figure 5A:
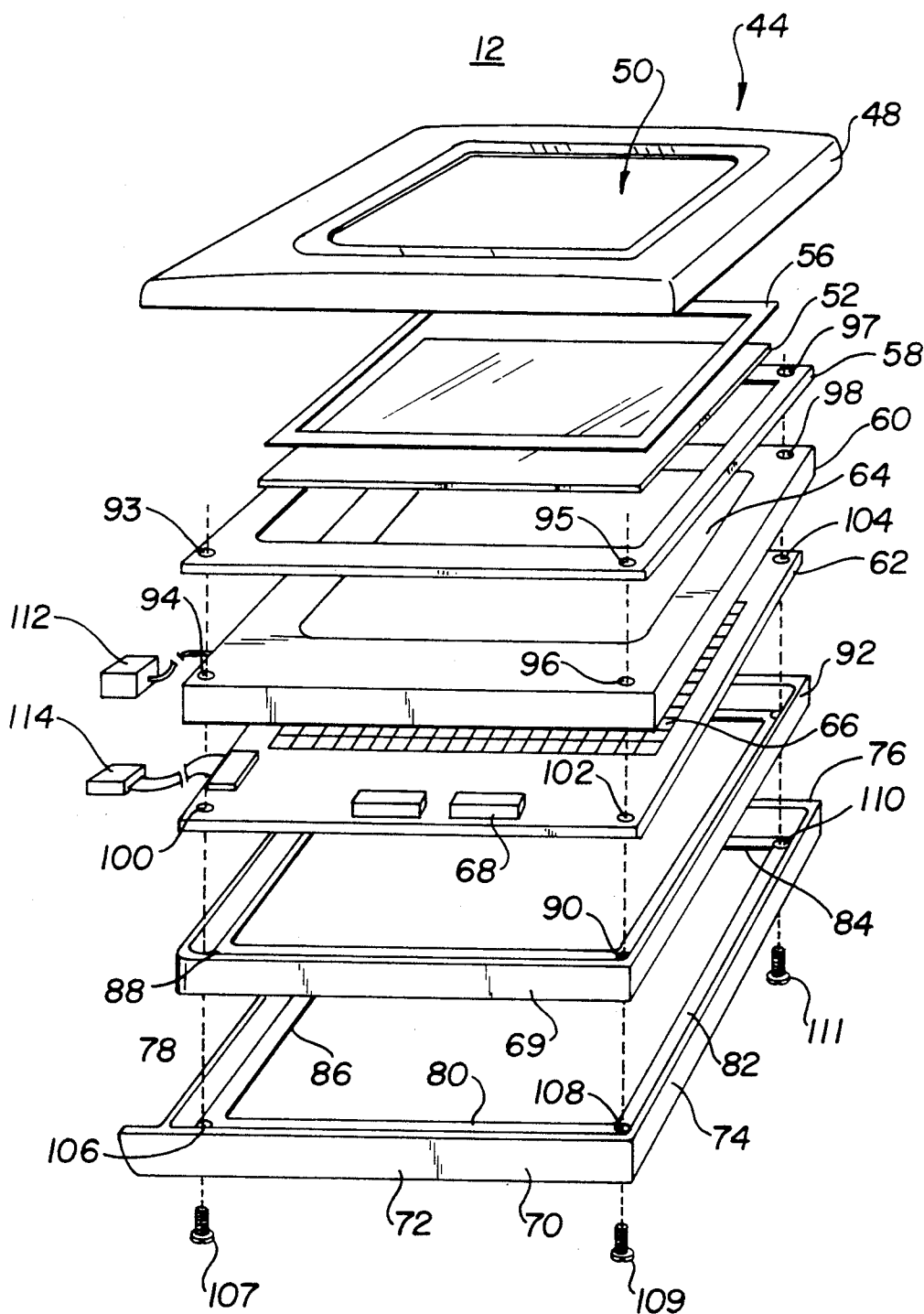
FIG. 5A is a exploded view in perspective of the front display portion of the workslate unit.
Figure 5B:
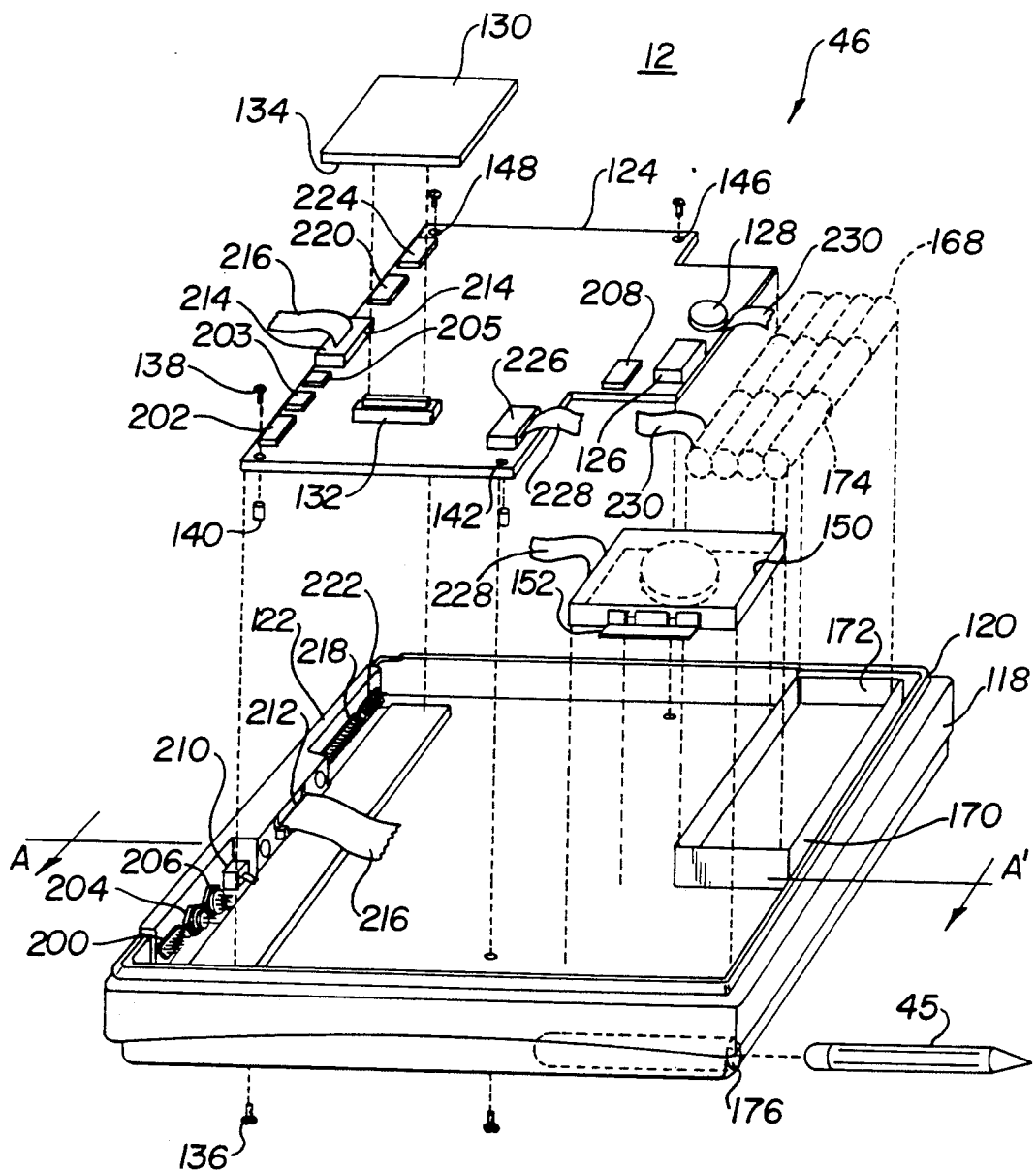
FIG. 5B is an exploded view in perspective showing the arrangement of components in the rear portion of the workslate unit.

Referring now to FIG. 5B, rear section 46 of workslate unit 12 includes an outer housing section 118 which mates with outer housing member 48. Front section 44 and rear section 46 are joined to form workslate unit 12. Specifically, an offset lip 120 formed integrally with outer housing member 118 is engaged with the interior wall of outer housing member 48 to join the respective sections. Connector plate 122 is disposed along one edge of outer housing member 118 to provide a support surface for electrical connectors which are discussed in further detail below. Motherboard 124 is disposed adjacent to connector plate 122. Motherboard 124 comprises a complete computer system including a microprocessor and all essential support components discussed in detail below. In addition, motherboard 124 includes a modem 126, as well as power management circuitry 128. Motherboard 124 is also adapted to receive memory expansion board 130 which may be attached to motherboard 124 in a conventional "piggyback" arrangement via connectors 132, 134. Motherboard 124 may be attached to outer housing section 118 via fastener and spacer posts assemblies (i.e. fasteners 136, 138 and spacer post 140). Similar fastener and spacer post combinations may be used to secure motherboard 124 at attachment points 142, 146, 148.

Figure 5C:
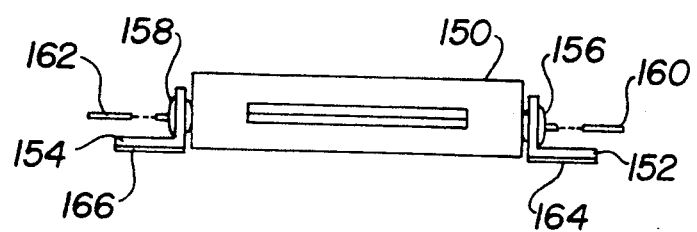
FIG. 5C is a side view showing the arrangement for mounting the mass data storage device in the rear portion of FIG. 5B.
Figure 6A:
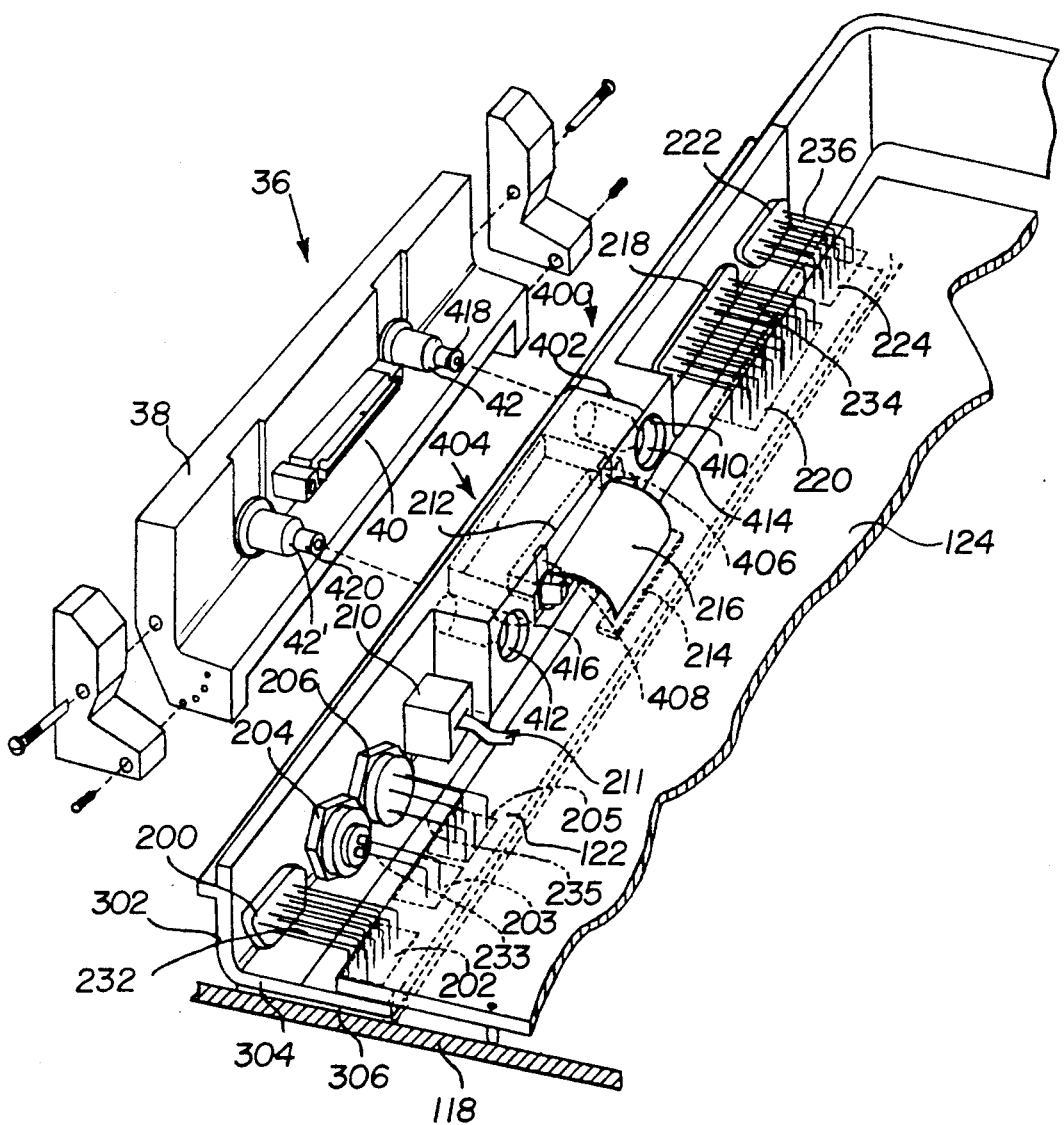
FIG. 6A is a view in perspective of the workslate connector plate and associated docking assembly.
Figure 6B:
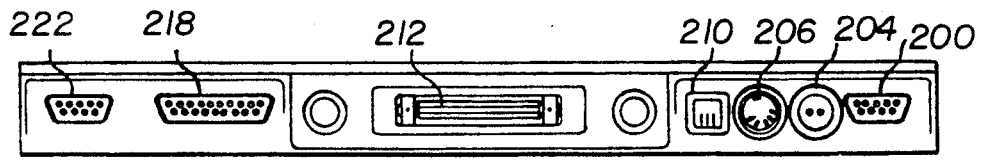
FIG. 6B is a front view of the workslate connector plate.
Figure 5D:
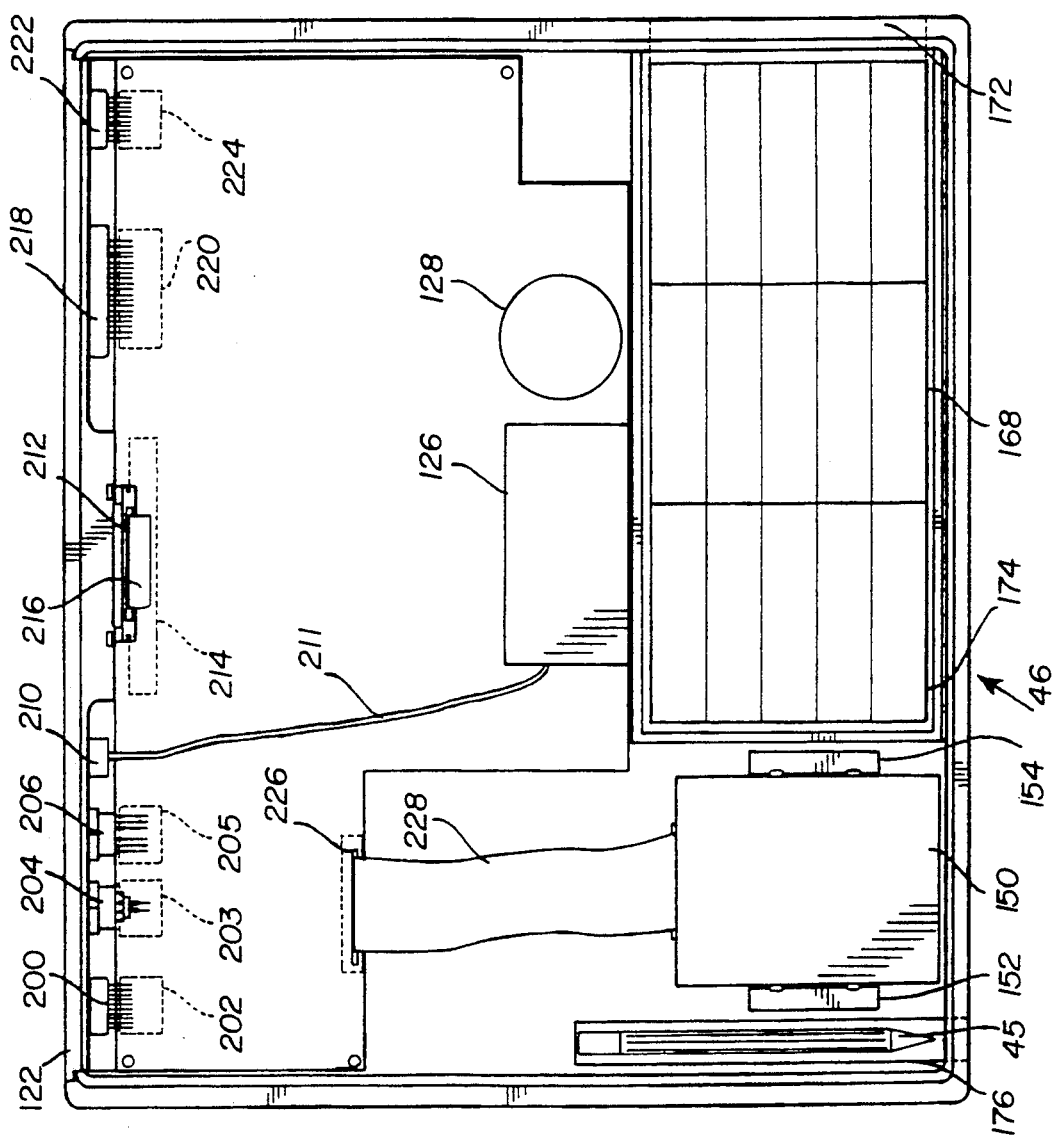
FIG. 5D is a top view showing the arrangement of components of the workslate unit.

A mass data storage device 150 such as a hard disk drive is disposed in outer housing member 118 as shown in FIG. 5C. Mass data storage device 150 is preferably of the type MD260/MD2100 available from Areal Technology, San Jose, Calif. A plurality of mounting brackets 152, 154 having a generally "L" shaped cross-section are used for securing mass data storage device 150 to outer housing section 118. Specifically, shock absorbing grommets (e.g. grommets 156, 158) are mounted in apertures of brackets 152, 158. Conventional fasteners (e.g. fasteners 160, 162) secure brackets 152, 154 to mass data storage device 150 through grommets 156, 158. Brackets 152, 154 may be secured to outer housing member 118 with adhesive strips 164, 166, respectively (FIG. 5C).

A rechargeable battery pack 168 is disposed within battery cavity 170 which is formed integrally in or made separately and fastened to outer housing member 118. A removable battery door 172 may be provided for the removal and replacement of battery pack 168. In the preferred practice of the present invention, battery pack 168 comprises fifteen cells of the type KR1700AE, available for Sanyo Energy Corp., San Diego, Calif., wherein each of the respective cells are coupled in series to provide a nominal output voltage of approximately 22.5 volts. A layer of conventional heat shrink type material 174 may be disposed about the respective cells to retain the cells in a predetermined orientation.

Outer housing member 118 further includes a cavity 176 for storing stylus 45. Stylus 45 is preferably of the electromagnetic Motherboard 124 further includes a plurality of attachment areas for receiving electrical connections from the connector plate 122 as well as the respective computer support components. Referring now to FIGS. 5B, 5D, 6A and 6B, connector plate 122 includes the following: a conventional sealed 9 pin "D" type connector 200 which is coupled to motherboard attachment area 202 with conventional means; a sealed power connector 204 of the type DEE102A052, and available from W. W. Fisher SA, Apples, Switzerland, coupled to motherboard attachment area 203 with conventional means; a sealed 8 pin circular DIN connector 206 coupled to motherboard attachment area 205 with conventional means; a sealed conventional RJ-11 telephone jack 210 coupled to modem circuitry 126 via shielded cable 211; a multi-pin connector 212 of the type Micropax 200, available from Dupont Electronics coupled to motherboard attachment area 214 via conventional ribbon cable 216; a 25 pin sealed "D" type connector 218 coupled to motherboard attachment area 220 with conventional means; and a 15 pin sealed high density "D" type connector 222 coupled to keyboard attachment area 224 with conventional means. Mass data storage device 150 is preferably attached to motherboard attachment area 226 via flexible printed circuit 228 to provide a degree of shock isolation between the motherboard and mass data storage device 150. Similarly, rechargeable battery pack 168 may be attached to power management circuitry 128 via conventional cable 230.

Those skilled in the art will appreciate that any of a number of means may be employed for attaching the respective connectors and cables to motherboard 124. For example, it is anticipated that connectors 200, 204, 206, 218 and 222 comprise conventional printed circuit board mounted connectors having angled leads 232, 233, 235, 234 and 236, respectively, (FIG. 6A) which may be directly soldered to conventional printed circuit-type plated through openings in motherboard 124, thus providing both electrical connection and mechanical stability. The flexible printed circuits 216, 228 may be coupled to the motherboard 124 either by soldering the respective conductors directly to motherboard 124 or via conventional detachable male/female connectors (not shown) disposed on the respective cables and motherboard, respectively.

In the preferred practice of the present invention, each of the respective connectors 200, 204, 206, 210, 212, 218 and 222 are coupled in watertight engagement with connector plate 122 to provide a barrier from moisture and atmospheric pollutants from entering the interior portion of workslate 12. As is most clearly seen in FIG. 6B, connector 222 is preferably used for coupling video and display information to workslate 12; connector 218 provides parallel port connections; connector 204 provides D.C. power connections; connector 206 provides keyboard connections; connector 210 provides telephone and modem connections; and connector 200 provides serial port connections. This arrangement allows workslate unit 12 to be used as a stand alone unit with the capability of interfacing to a wide variety of support components. In addition, connector 212 provides means for interfacing workslate unit 12 to base unit 14 as is further discussed below. It is contemplated that in addition to all of the connections mentioned above, connector 212 also includes connections for the complete address and data bus for the computer system housed in workslate 12.

Referring again to FIG. 6A, the connector plate 122 has a generally "L" shaped cross-section formed by approximately perpendicular flanged members 302, 304. Flanged section 304 may be attached to outer housing member 118 with a layer of adhesive 306. In the preferred practice of the present invention, connector plate 122 is formed of a heat conductive material such as aluminum or steel. Accordingly, it is anticipated that connector plate 122 also provides a heat sinking or dissipating function for workslate unit 12. In addition to supporting the respective electrical connectors mentioned above, flanged section 302 further includes mounting area 400 for attaching workslate unit 12 to base unit 14. Specifically, mounting area 400 is formed integrally with flanged section 302 and includes a region 402 having a relatively large cross-sectional area with respect to the remainder of flanged section 302. Cavity 404 is formed within region 402 wherein a portion of connector 212 extends into cavity for mating with connector 40 of docking mechanism 36. A plurality of lateral struts 406, 408 may be provided for securing connector 212 to area 402 to provide mechanical stability when mating connectors 40 and 212. In the alternative, a mounting flange (not shown) may be disposed about the periphery of connector 212 for mounting connector 212 to connector plate 122. Area 402 further includes a plurality of tapered bores 410, 412 for complementing and receiving latching posts 42, 42', respectively. Tapered bores 410, 412 include annular channels 414, 416 for receiving locking bearings 418, 420, which are further discussed below. Annular channel 416 is most clearly seen in FIG. 7. In the alternative, a plurality of sealed inserts (not shown) may be inserted into tapered bores 410, 412 to seal tapered bores 410, 412 from the environment. The respective sealed inserts may be in the form of resilient plugs or may alternatively comprise permanently installed having an interior cavity which complements the exterior shape of latching posts 42, 42'.

Once the front and rear sections 44, 46, respectively, are assembled, they are mated together as shown in FIG. 7. The resulting workslate structure is extremely compact, and stable. Front and rear sections 44, 46 may be joined with any of a number of conventional means including adhesive or frictional attachment or in the alternative, conventional fasteners (e.g. fastener 424) may be disposed about the periphery of workslate unit 12 engaging outer housing 48 and flanged section 120 into threaded inserts (e.g. threaded insert 425) pressed into the respective vertical walls of collar member 70. Regardless of the specific method of attachment, it is contemplated that front and rear section 44, 46 are formed in watertight engagement.

Figure 8:
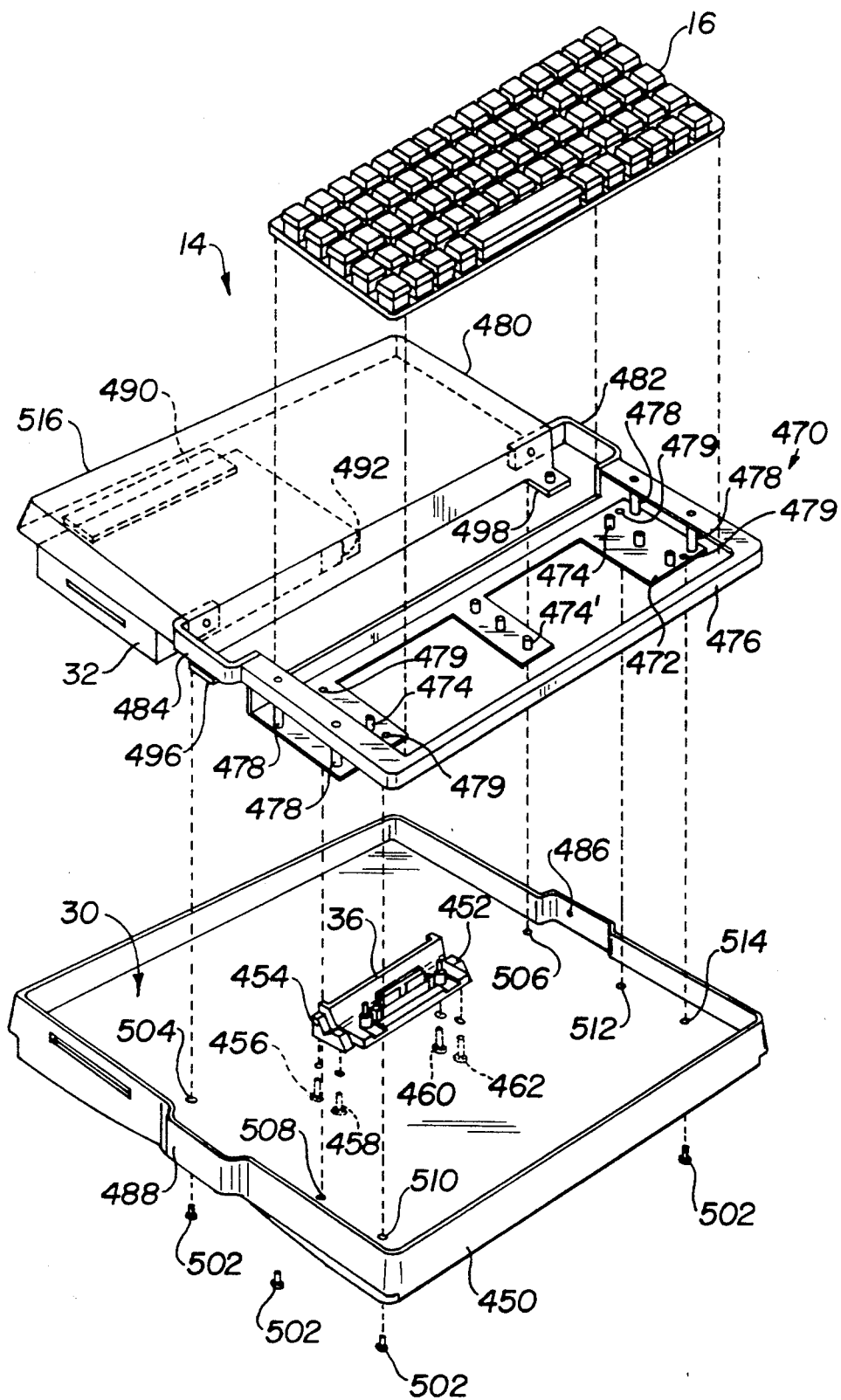
FIG. 8 is an exploded view in perspective of the desktop base unit used in conjunction with the workslate unit of FIGS. 2 and 3.
Figure 9:
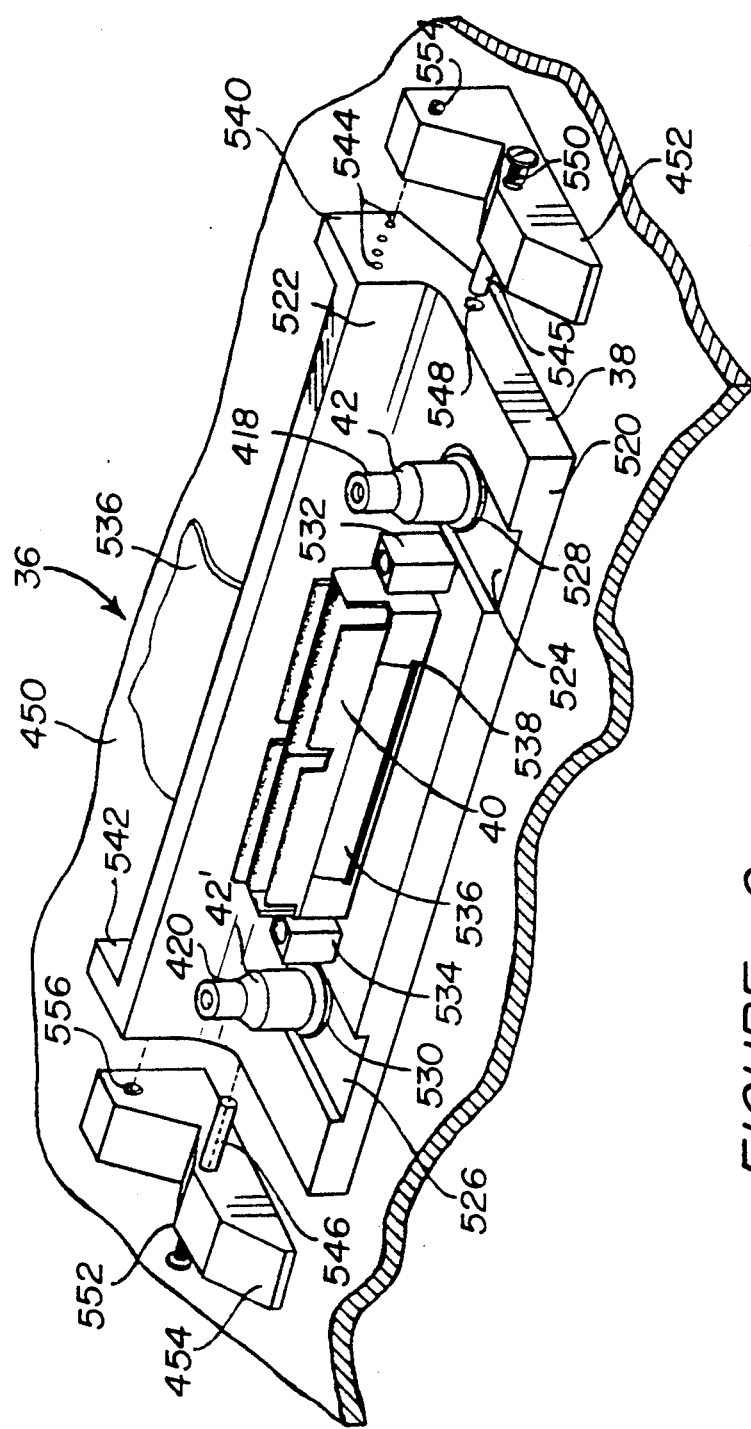
FIG. 9 is a view in perspective of the docking assembly of FIG. 6A and FIG. 8.

Referring now to FIG. 8, the base unit 14 comprises an outer housing 450 which is preferably formed with the same material used for fabricating housing members 48, 118. Docking assembly 36 is pivotally secured to housing member 450 with hinge support members 452, 454 which are secured to housing member 450 with conventional fasteners 456-462. Assembly 470 is then secured to housing member 450. Assembly 470 includes keyboard mounting bracket 472 which includes a plurality of mounting posts (e.g. mounting posts 474) for receiving keyboard 16. Keyboard 16 is formed as a single module of the type U04003001 available from Keytronic, Spokane, Wash. A finishing collar 476 secured to keyboard mounting bracket 472 with conventional mounting posts 478 which may be secured between mounting bracket 472 and finishing collar 476 with conventional means. A rear cover 480 is attached to finishing collar 476 via finishing brackets 482, 484 which are adapted to cover areas 486, 488, respectively, of housing 450. Finishing brackets 482, 484 may be secured to rear cover 480 and finishing collar 476 with conventional means. Rear cover 480 includes integral mounting flanges 490, 492 for mounting floppy disk drive 32. Rear cover 480 further includes integral mounting flanges 496, 498, wherein assembly 470 may be secured to housing member 450 with conventional fasteners 502 which engage threaded inserts 479 in mounting flanges 496, 498 through apertures 504, 506 and which engage threaded inserts 479 in mounting bracket 472 through apertures 508-514. Additional fasteners (not shown) may be provided for securing portion 516 of cover 480 to housing member 450.

Figures 10A, 10B:
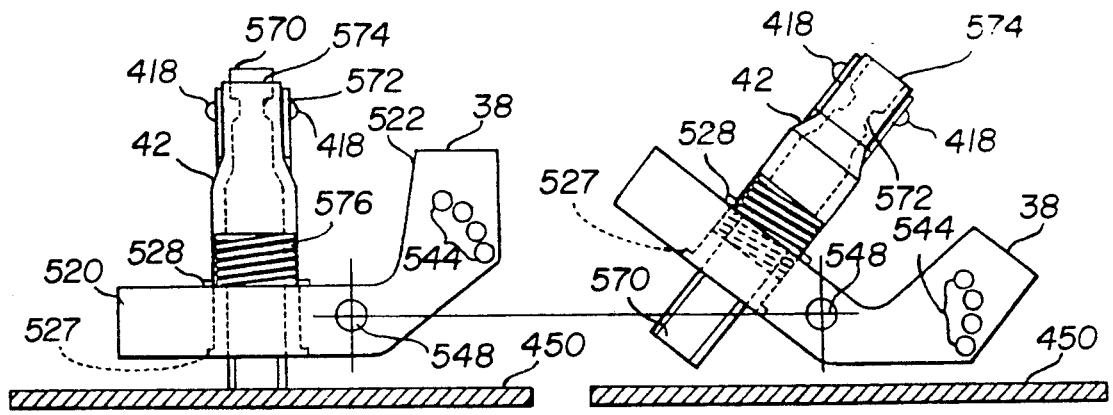
FIGS. 10A and 10B are side views detailing the operation of the docking assembly of FIG. 6A and FIG. 8.
Figure 10C:
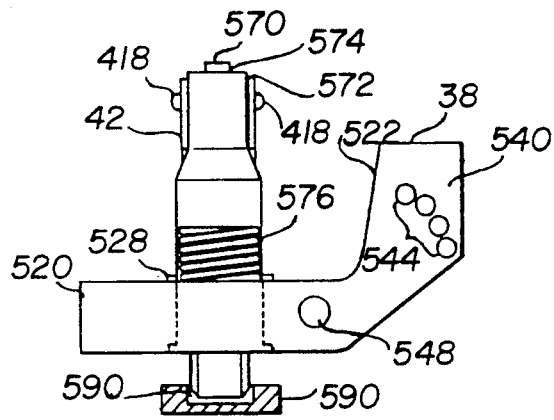
FIGS. 10C-10D are side views of a latching control mechanism which may be used with the docking assembly of FIGS. 10A-10B.
Figure 10D:
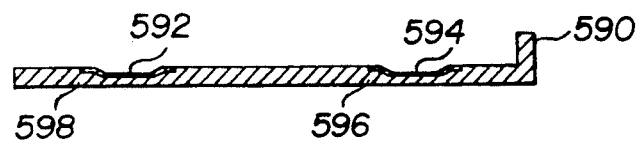
Figure 10E:
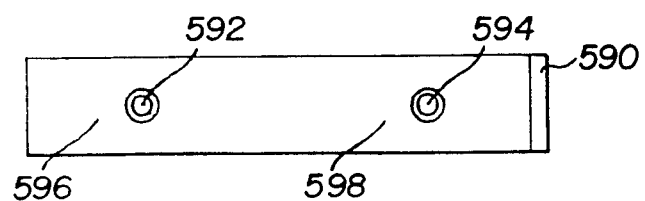
FIG. 10E is a top view of the latching control mechanism of FIGS. 10C-10D.
Figure 11A:
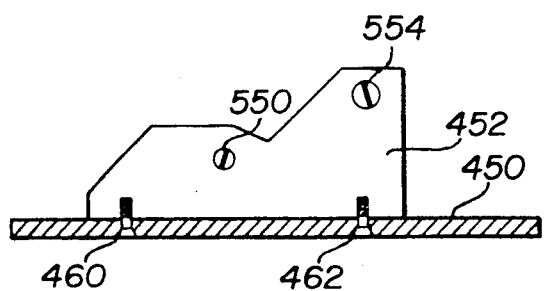
FIGS. 11A-11C are side views of base members used for securing the docking assembly to the base unit.
Figure 11B:
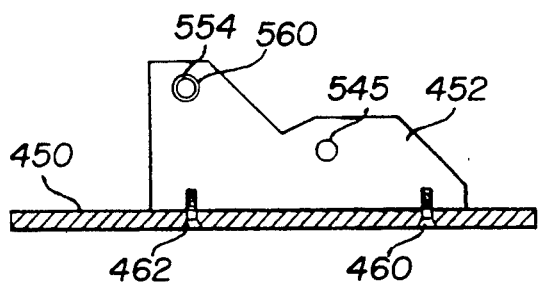
Figure 11C:
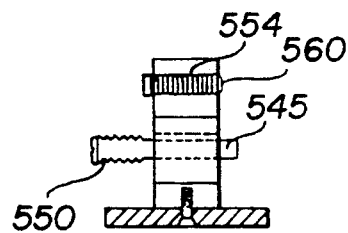

Referring now to FIG. 9, 10A-10B and 11A-11C, docking mechanism 36 includes a support flange 38 which is pivotally attached to housing member 450 with hinge support members 452 454. Support flange 38 includes a base portion 520 and a rear support portion 522 which forms a complementary shape with respect to connector plate 122. Latching posts 42, 42' are disposed within recesses 524, 526, respectively, and may be secured to base portion 520 with flanges (e.g. flange 527, FIG. 10) and conventional retaining rings 528, 530, respectively. Electrical connector 40 is secured to base portion 520 with support posts 532, 534 which are secured between electrical connector 40 and base portion 520 with conventional means. Conventional flexible circuit 536 is coupled to electrical connector 40 and extends through aperture 538 to couple electrical connector 40 to connector plate 18, to floppy disk drive 32, and keyboard 16 or any of a variety of other peripheral components. Those skilled in the art will appreciate that flexible printed circuit 536 may comprise single or multiple sections of flexible printed circuits which are routed separately to the respective components of base unit 14. A plurality of rearwardly extending flanges 540, 542 are formed integrally with support flange 38 to provide control surfaces for controlling the pivotal position of docking mechanism 36. Specifically, a plurality of angularly offset detents 544 are disposed in the respective faces of flanges 540, 542. Hinge support members 452, 454 ar pivotally coupled to support flange 38 with axially disposed pivot posts 545, 546 which are received in annular bores (e.g. annular bore 548 of support flange 38). Each pivot post includes a threaded portion 550, 552 which threadably engages base members 452, 454, respectively (FIG. 11A-11C). In addition, spring loaded ball bearing members 554, 556 are threadably disposed in hinge support members 452, 454, respectively, wherein each respective ball bearing member includes an outwardly biased ball bearing 560, 562 which engages one of the respective plurality of detents 544 as support flange 38 is pivoted between a plurality of predetermined positions. As support flange is pivoted between positions, each respective spring biased ball bearing is compressed slightly until it engages the next adjacent detent. Accordingly, a plurality of pivoting positions are provided with each respective position defined by the relative position of the respective detents 544 on the respective flanges 540, 542.

Referring now to FIGS. 10A and 10B, in another aspect of the present invention, each of the respective latching posts 42, 42' are provided with a means for positively locking workslate 12 to base unit 14. As noted above, each respective latching post 42, 42' is provided with latching bearings 418, 420 which engage annular channels 414, 416 of connector plate 122. Since latching posts 42, 42' are identical, only the operation of latching post 42 is discussed herein. Latching bearings 418 operate in either latched or retractable modes as controlled by a spring loaded, axially disposed control rod 570. Control rod 570 includes an axial recessed area 572 which allows the respective latching bearings 418 to retract, and further includes a portion 574 which urges the respective latching bearings outwardly. When support flange 38 is positioned so that workslate unit 12 is substantially vertical, control rod is urged upwardly via contact with housing 450, thus compressing biasing spring and bringing axial recessed area 572 into alignment with latching bearings 418, thus permitting latching bearings 418 to retract into latching post 42, as shown in FIG. 10A. In this position, workslate unit 12 may be readily inserted onto or removed from latching posts 42. As shown in FIG. 10B, as support flange 38 is pivoted, control rod 570 is urged outwardly by bias spring 576, thus forcing portion 574 into alignment with latching bearings 418, thus locking latching bearings 418 in the fully extended position. In this position, latching bearings engage annular channels 414, 416, thus locking workslate unit 12 to support flange 38.

Figure 12:
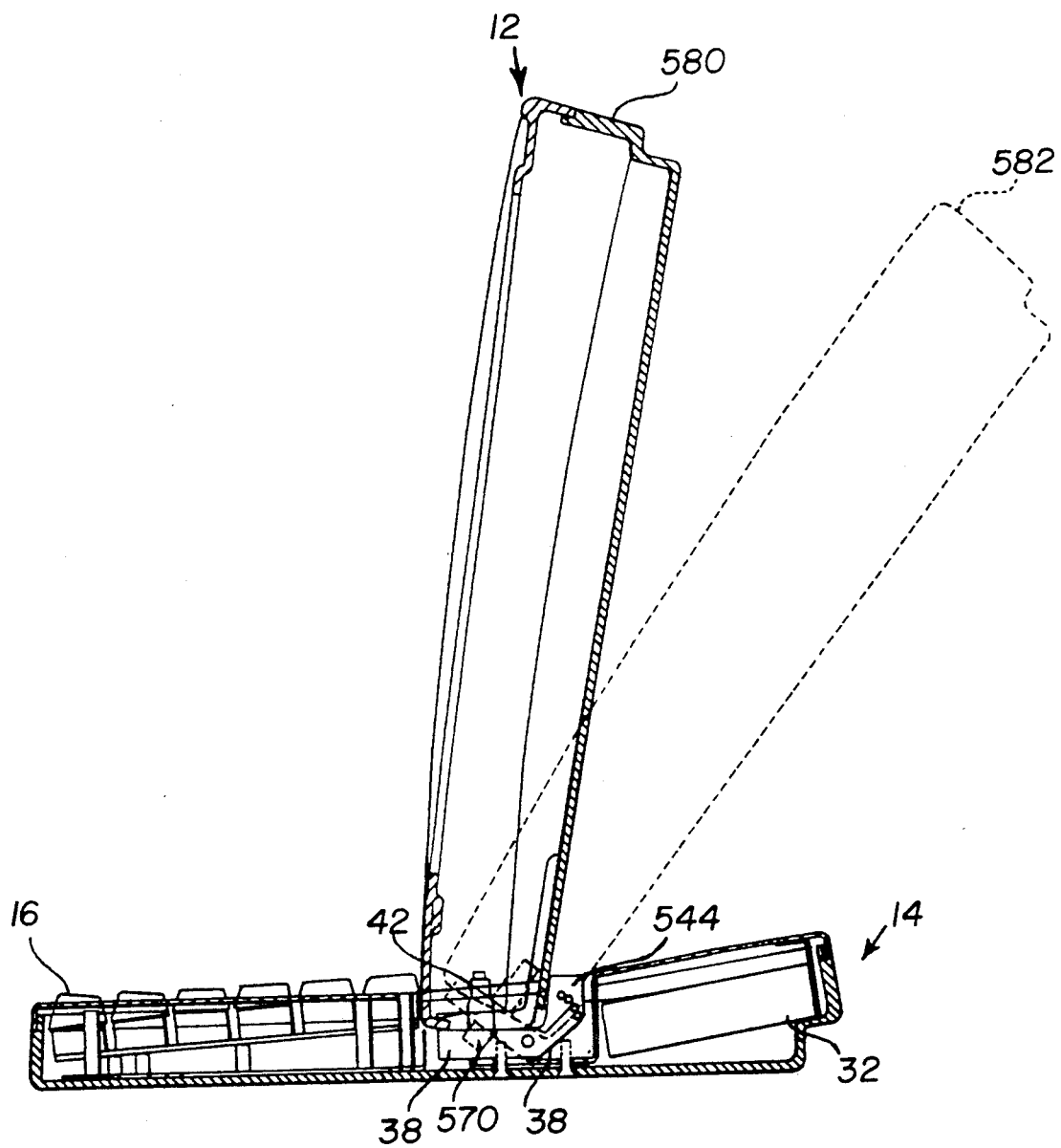
FIG. 12 is a cross-sectional view taken along section B—B' showing the operation of the docking assembly with the workslate attached to the base unit.

The respective latched unlatched positions of workslate unit 12 are most clearly seen in FIG. 12. In position 580, workslate 12 is in a substantially vertical position wherein control rod 570 engages housing member 450, thus permitting latching bearings to retract. As workslate unit 12 is pivoted to position 582, control rod 570 is urged outwardly, thus locking workslate unit 12 to base unit 14. At the same time the pivotal position of workslate unit 12 is controlled by the relative position of detents 544 with respect to hinge support members 452, 454.

An optional latching control lever 590 may also be provided as shown in FIGS. 10C-10E. In this embodiment, latching control lever 590 is longitudinally disposed beneath the respective control rods (e.g. control rod 570) wherein latching control lever 590 includes a plurality of recessed areas 592, 594 which allow the respective control rods to extend to the latched position regardless of the relative position of workslate 12. Workslate 12 may then be unlatched by placing workslate 12 in the substantially vertical position and by sliding control lever 590 so that the respective control rods engages leveled edges 596, 598, thus urging the respective control rods to the unlatched positions.

Figure 13A:
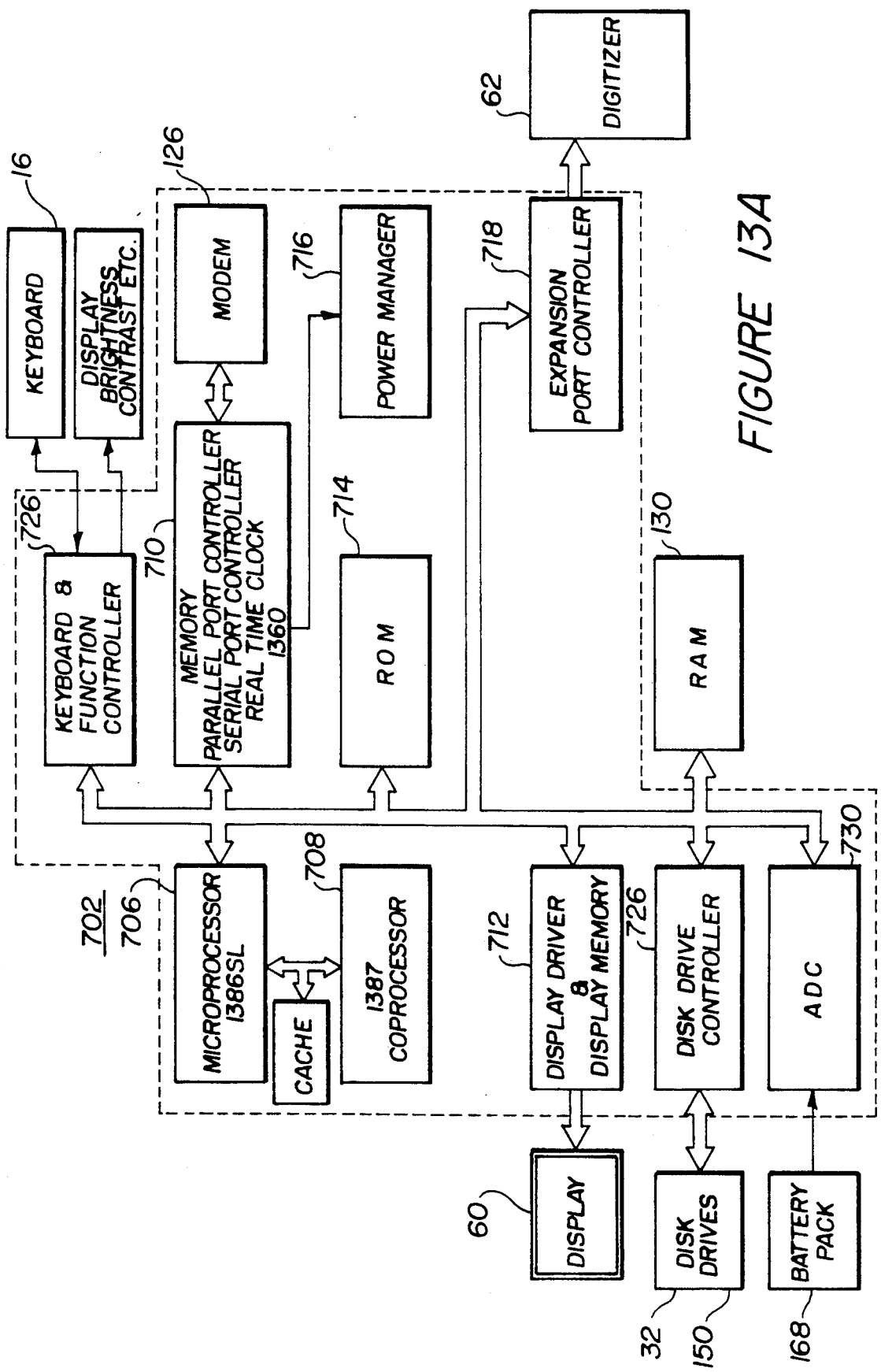
FIG. 13A is a block diagram of the electrical components of the workslate unit of the present invention.
Figure 13B:
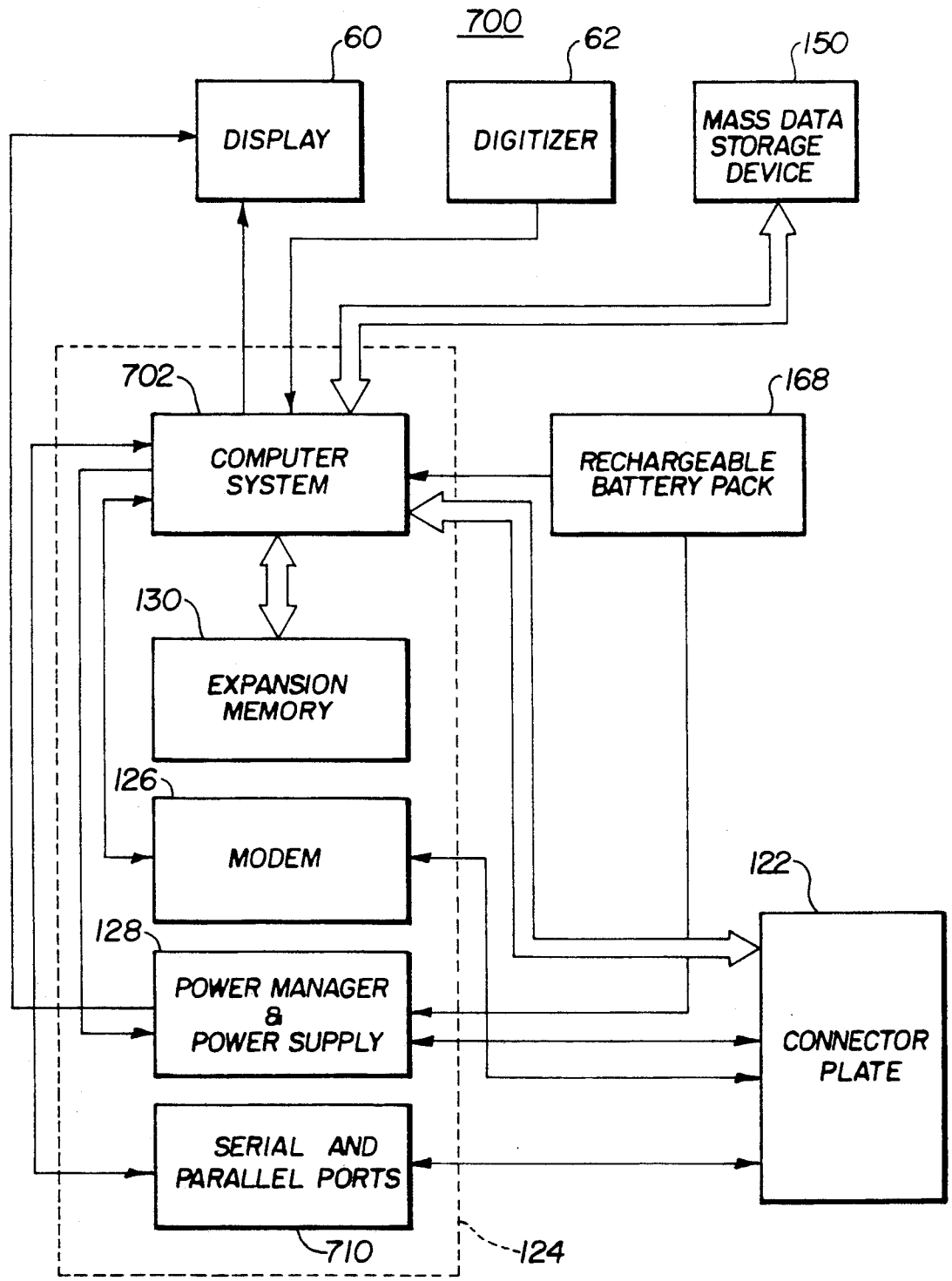
FIG. 13B is block diagram of the motherboard components of FIG. 13A.
Figure 13C:
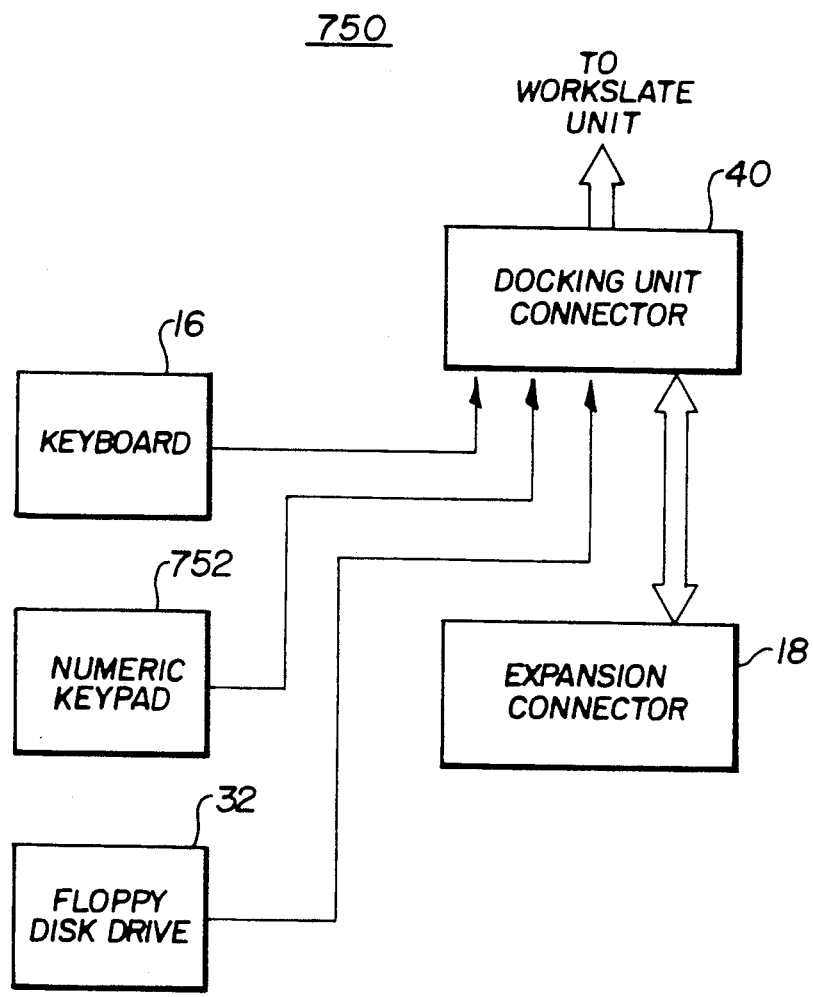
FIG. 13C is a block diagram of the electrical components of the desktop base unit of the present invention.

Referring now to FIGS. 13A and 13B, the workslate 12 contains a fully functional computer system 700 including the major components shown in FIG. 13B. Computer system 700 includes display 60, digitizer 62, mass data storage device 150, and the respective components located on motherboard 124. In addition, workslate unit 12 includes a rechargeable battery pack 168. The external connections for system 700 are provided by the connectors located on connection plate 122. Motherboard 124 incorporates computer system 702, expansion memory 132, modem 126, power management circuitry 128 and serial and parallel ports 704.

As shown in FIG. 13A, computer system 702 comprises a conventional Intel I386 microprocessor 706, an Intel I387 coprocessor 708, and an Intel 82360SL support integrated circuit 710. Support circuit 710 includes serial and parallel port interfaces and a real time clock. Computer system 702 further includes an 82456 display driver with memory 712. Display driver 702 is available from Chips Technologies, Sunnyvale, Calif. The computer system BIOS software is stored in ROM which may be of the type 27020 available from Intel. Power management circuitry 714 includes an array of conventional switching transistors responsive to signals generated by support integrated circuit 710 to selectively apply power to the respective components of workslate 12. Power manager 716 further includes a conventional step down regulator type DC—DC convertor for converting the power produced by battery pack 168 to the appropriate level. Modem 126 may incorporate conventional means to provide high speed data communication as well as compatibility with conventional facsimile systems. Computer system 702 is further coupled to conventional RAM 130. Computer system 702 further includes disk drive controllers 716 for controlling the respective disk drives, and a keyboard and function controller 720 for controlling the keyboard 16 and such parameters as the brightness and contrast of LCD display 60. An analog to digital converter 736 is provided for sensing various analog functions such as the battery pack operating voltage. Finally, expansion port controller 718 is provided for controlling digitizer 62.

Those skilled in the art will appreciate that the respective components of motherboard 124 may readily be connected on a conventional printed circuit board using well-known techniques. The respective data manuals for each of the components of motherboard 124 provide the information regarding the specific interconnections for system 700.

The base unit electronics 750 includes keyboard 16, an optional numeric keypad 752, and a floppy disk drive 32. Base unit 14 further includes docking unit connector 40 and expansion connectors 18 discussed above. The base unit 14 may be readily modified to include any of a number of additional peripheral components (not shown).

Figure 14:
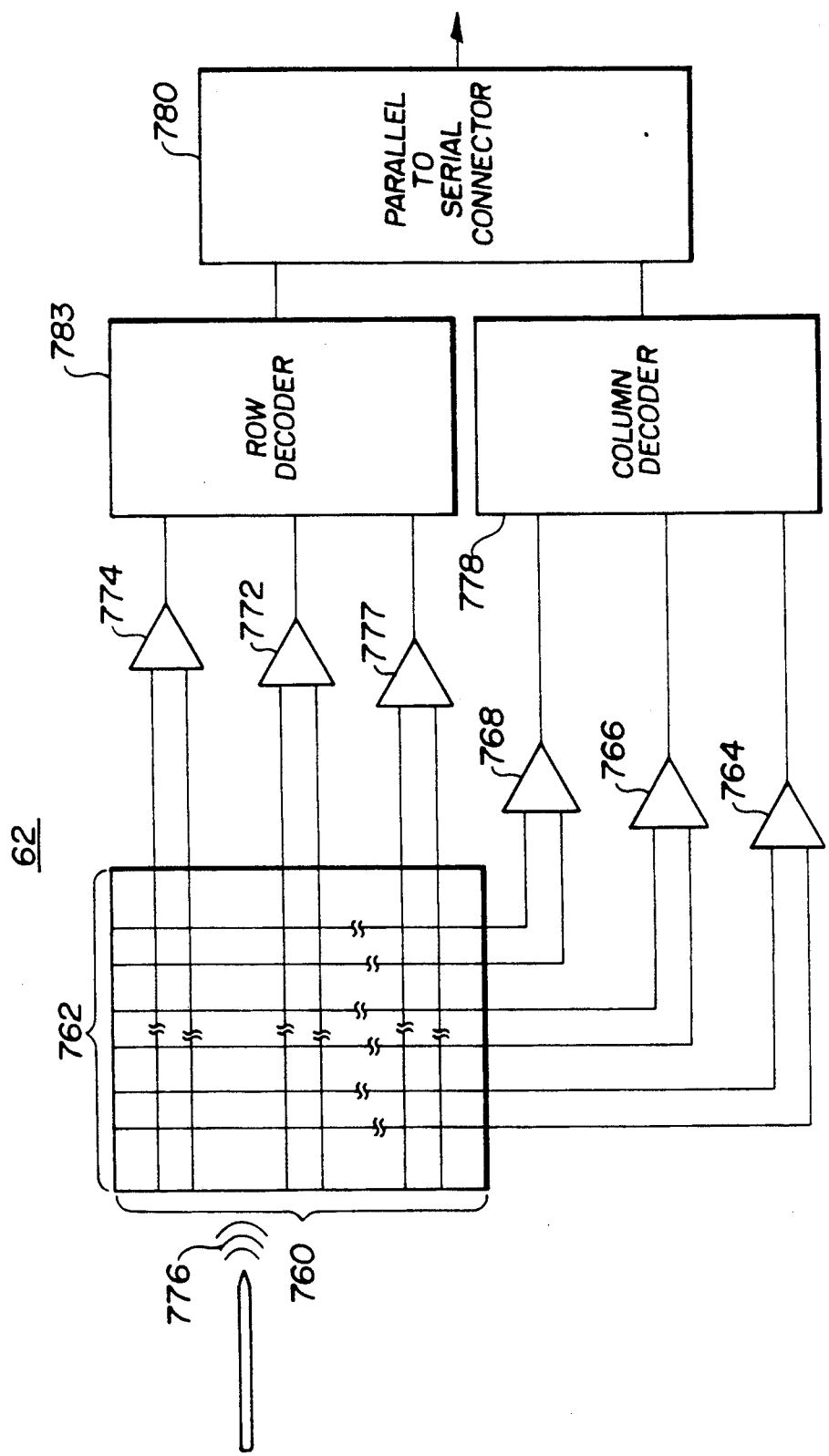
FIG. 14 is a schematic and block diagram of the digitizer of FIG. 5A.

Referring now to FIGS. 14, the digitizer 62 includes an array of orthogonally organized rows and columns 760, 762 of overlying conductive strips, forming an grid of X-Y intersections defining specific locations on the digitizer. The respective conductive strips are coupled to sensing amplifiers 764-774 which sense the electromagnetic signal 776 induced into the conductive strips by stylus 45 which generates a tiny electromagnetic field 776 in an area proximate its tip. This electromagnetic field is of sufficient intensity to penetrate display 60 and induce sufficient current flow in the respective conductive strips to activate sensing amplifiers 764-774 coupled to each respective row and column thus generating positional information processed by row and column 778, 780 decoders. The decoded signals are then converted to a serial data stream by parallel to serial convertor 780. The output of parallel to serial converter 45 is coupled to motherboard 124. One example of a device which may be used for digitizer 62 may be fully understood by reference to U.S. Pat. No. 4,786,765, incorporated herein by reference.

Figure 15A:
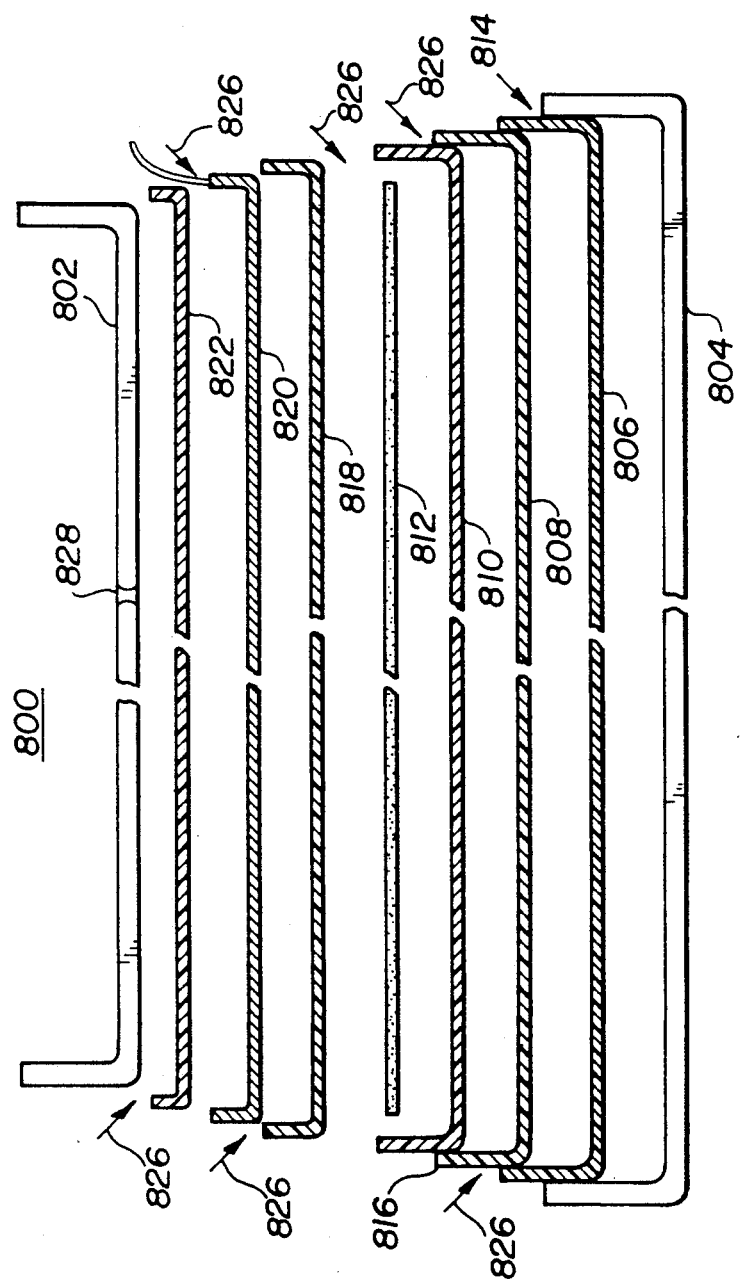
FIG. 15A is a cross-sectional view detailing the process used for manufacturing the multi-layer laminate structure of the housing members of the present invention.
Figure 15B:
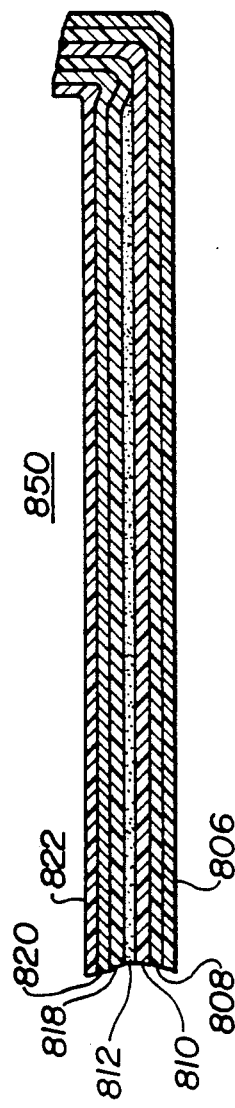
FIG. 15B is a cross-sectional view of the multi-layer laminate structure resulting from the process described in conjunction with FIG. 14A.

Referring now to FIGS. 15A and 15B, the respective housing elements of the present invention are fabricated with a multi-layer composite structure which is both light weight and extremely resistant to mechanical shock. The composite structure 850 is formed with the following process. Male and female mold elements 802, 804 are formed with positive and negative impressions, respectively, of the housing element being formed. A layer of gelcoat material 806, approximately 0.105 inches thick is deposited in negative mold element 804. In the preferred practice of the present invention, a material designated Ferro Orthophalic gelcoat, available from Ferro Corp. is used for gelcoat layer 806. Woven structural fiber layers 808, 810 are then overlaid over gelcoat layer 806. Woven structural fiber layers 808, 810 preferably comprise a material designated Spectra 1000, available from Allied Fiber division of Allied Signal Corp. This material comprises a #985 PT (plasma treated) woven fabric of extended chain polyethylene fibers which are generally in the class of materials known as ballistic fibers. Another material in this class which may also be used for layers 808, 810, comprises Kevlar, available from Dupont. In the preferred practice of the present invention, woven structural fiber layers 808, 810 are approximately 0.020 inches thick. Once layers 808, 810 are laid in mold 804, a layer of foam core material 812 is placed over the planar area of the structure. Foam core layer 812 does cover side wall areas 814, 816. Foam core layer 812 is preferably of type LMP foam, type number CCL100, available by Windsor Fiberglass, Inc. A layer of structural fibers 818 is then overlaid over foam core layer 812. Structural fiber layer 818 is comprises the same material as structural fiber layers 808, 810. An electrically conductive, magnetic shielding layer 820 is then overlaid over structural fiber layer 818. Shielding layer 820 preferably comprises expanded copper foil 077 mesh, available from Dellcer Corp., Branford, Conn. Layer 820 is preferably 0.002-0.012 inches thick. Finally, another layer or woven structural fibers 822 is overlaid over shielding layer 820 wherein woven structural fiber layer 822 comprises the same material used in fiber layers 808, 810 and 818. Once the respective layers are arranged in mold 804, they are enclosed between molds 802, 804 and the respective molds are held under slight pressure to compress the respective layers to within 0.100 inches thick. A thermoset resin (represented by arrows 826) is then injected through the injection port 828 into the layers between the respective molds 802, 804 in a process referred to as resin transfer molding. As the resin is injected into the structure under pressure, at the center of the molds, air contained in the respective layers is forced out at the perimeter as the air is replaced by resin. The respective layers are then completely encapsulated by resin. In the preferred practice of the present invention, a resin designated Modar, modified acrylic resin, #835ACS, available from ICI Acrylics KSM, Inc. is used in the injection process.

After an appropriate cure cycle time, the respective mold sections are separated resulting in structure 850 shown in FIG. 14B. After removal from the mold, the edges of the port may be cut to expose the shielding material and coated with a permanent conductive coating to enable the shielding of the mating parts 12 × 14 to be electrically joined during assembly. The connector plate 122 may also be electrically connected to the shielding material in the outer housing member in the same fashion to enable connection of the shielding to ground plane of the internal components. Those skilled in the art will appreciate that the process 800 may be adapted to construct housing members of virtually any configuration and the structure 850 may be readily drilled for forming apertures for mounting components and readily adhered to for attaching mounting structures or finishing appliances. The structure 850 is both lightweight and extremely resilient and can readily withstand impacts of extreme force.

In summary, an improved modular computer system has been described. The modular computer system of the present invention provides a system which may be used as a stand alone workslate or may be used with a base unit in a desktop mode. The modular computer system of the present invention includes a housing structure which is substantially immune to environmental degregation and which highly resistant to mechanical shocks. Accordingly, other uses and modifications of the present invention will be readily apparent to persons of ordinary skill and all of such uses and modifications are intended to fall within the scope of the appended claims.

We claim:

1. A composite housing for a computer comprising:
   a dense layer forming an external surface of said housing;
   a first layer of woven structural fiber material overlaying said dense layer;
   a layer of closed cell foam material overlaying said first layer of woven structural fiber material;
   a second layer of woven structural fiber material overlaying said layer of closed cell foam material;
   a layer of electromagnetic shielding material overlaying said second layer of woven structural material; and
   a third layer of woven structural fiber material, wherein first, second and third layers of woven structural fibers, said layer of electromagnetic shielding and said layer of closed cell foam material of said composite housing are permeated with thermoset acrylic material to bind all the respective layers of said composite housing together.

2. The composite housing of claim 1, wherein said first layer of woven structural fibers includes one or more plys of said woven structural fibers.

3. The composite housing of claim 1, wherein said first, second and third layers of structural fibers are taken from the group of ballistic materials consisting of aramid fibers, extend chain polyethelyne fibers, boron and graphite fibers.

4. The composite housing of claim 1, wherein said first layer of woven structural fibers is between 0.010 and 0.030 inches thick.

5. The composite housing of claim 1, wherein said layer of closed cell foam material is between 0.010 and 0.030 inches thick.

6. The composite housing of claim 1, wherein said second layer of woven layer of composite structural fibers is between 0.010 and 0.030 inches thick.

7. The composite housing of claim 1, wherein said layer of electromagnetic shielding material comprises copper mesh having a thickness of between 0.002 and 0.012 inches.

8. An improved method of fabricating a computer housing, said method comprising the steps of:
   (a) forming a first portion of said housing by performing the steps of:
   (i) depositing a layer of first layer of dense material in a female mold, said first layer of dense material forming the exterior surface of said housing, said mold defining a planar portion and a plurality of sidewalls;
   (ii) overlaying a first layer of woven structural fibers over said first layer of dense material;
   (iii) overlaying a layer of closed cell foam material over a planar portion of said first layer of woven structural fibers;
   (iv) overlaying a second layer of woven structural fibers over said first layer of structural fibers and said layer of closed cell foam material;
   (v) overlaying a layer of electromagnetic shielding material over said second layer of woven structural fibers;
   (vi) overlaying a third layer of woven structural fibers over said layer of electromagnetic shielding material;
   (vii) compressing said respective layers between said female mold and a male mold;
   (viii) injecting thermoset acrylic material into said compressed layers to bind said respective layers together; and
   (b) repeating steps (i) through (viii) to form a second portion of said housing wherein said first and second portions of said housing are joined to form said computer housing.

* * * * *